United States Patent
Kim et al.

(10) Patent No.: US 8,877,570 B2
(45) Date of Patent: Nov. 4, 2014

(54) ARRAY SUBSTRATE WITH IMPROVED PAD REGION AND METHOD FOR MANUFACTURING THE SAME

(71) Applicant: LG Display Co., Ltd., Seoul (KR)

(72) Inventors: JongWoo Kim, Gyeonggi-do (KR); ChangHo Oh, Seoul (KR); WonHyung Yoo, Seoul (KR); SangYoon Paik, Gyeonggi-do (KR); JunKi Kang, Gyeonggi-do (KR); JongHoon Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/691,143

(22) Filed: Nov. 30, 2012

(65) Prior Publication Data

US 2013/0140572 A1   Jun. 6, 2013

(30) Foreign Application Priority Data

Dec. 2, 2011   (KR) .......................... 10-2011-0128547

(51) Int. Cl.
*H01L 21/00* (2006.01)
*H01L 21/84* (2006.01)
*H01L 27/12* (2006.01)
*H01L 33/16* (2010.01)
*H01L 33/00* (2010.01)
*G02F 1/1345* (2006.01)

(52) U.S. Cl.
CPC .............. *H01L 33/16* (2013.01); *H01L 27/124* (2013.01); *H01L 33/005* (2013.01); *G02F 1/13452* (2013.01)
USPC   438/149; 438/151; 257/E21.32; 257/E21.561; 257/E21.7

(58) Field of Classification Search
CPC .......................... H01L 27/1214; H01L 29/4908
USPC ........................... 438/48, 128, 149, 151, 157; 257/E21.32, E21.561, E21.7
See application file for complete search history.

(56) References Cited

U.S. PATENT DOCUMENTS

2006/0043360 A1 *   3/2006  Kim et al. ........................ 257/40

* cited by examiner

*Primary Examiner* — Hoai V Pham
(74) *Attorney, Agent, or Firm* — Fenwick & West LLP

(57) ABSTRACT

An array substrate having a wiring of a pad region formed without an insulating film or without an insulating film and an organic film to reduce abnormal operations due to an increase in resistance caused by a contact margin at a high temperature, and a method for manufacturing the same are provided. The array substrate includes: an insulating substrate including a pad region and a thin film transistor (TFT) formation region; a first electrode layer formed in the pad region of the substrate; and a second electrode formed on the first electrode layer in an overlapping manner.

9 Claims, 8 Drawing Sheets

ARRAY SUBSTRATE WITH IMPROVED PAD REGION AND METHOD FOR MANUFACTURING THE SAME

CROSS-REFERENCE TO RELATED APPLICATION

This application claims priority to Korean Patent Application No. 10-2011-0128547, filed on Dec. 2, 2011, the contents of which is hereby incorporated by reference for all purposes as if fully set forth herein in its entirety.

BACKGROUND

1. Field of the Invention

The present invention relates to an array substrate and a method for manufacturing the same and, more particularly, to an array substrate in which a wiring of a pad region is formed without an insulating film or without an insulating film and an organic film to reduce abnormal operations due to an increase in resistance caused by a contact margin in a high temperature environment, and a method for manufacturing the same.

2. Description of the Related Art

As information society is advancing, demand for display devices for displaying images is increasing in various forms, and recently, various flat display devices such as a liquid crystal display (LCD), a plasma display panel (PDP), an organic light emitting diode (OLED), and the like, have been utilized.

Among the flat display devices, an LCD device having advantages in that it is smaller, lighter, and thinner and is operated with low power consumption has been commonly used.

In general, an LCD device displays an image by adjusting light transmittance of liquid crystal having dielectric anisotropy by using a field.

An LCD device includes a color filter substrate, an array substrate, and a liquid crystal layer formed between the color filter substrate and the array substrate.

Hereinafter, a structure of a general LCD device will be described in detail with reference to FIGS. 1 to 3. FIG. 1 is a view illustrating a connection relationship between a liquid crystal panel and a flexible circuit board. FIG. 2A is an enlarged view of a portion 'A' in FIG. 1. FIG. 2B is a plan view of a second electrode layer 16 in FIG. 1. FIG. 2C is a sectional view taken along line I-I' in FIG. 2B. FIG. 3 is a view illustrating a connection relationship between an array substrate and a flexible circuit board.

As illustrated in FIGS. 1 to 3, the related art array substrate 10 includes a pad region (a) and a thin film transistor (TFT) formation region (b). A first electrode layer 12, an insulating film 14, and a second electrode layer 16 are sequentially formed on a substrate 10 of the pad region (a). Here, the first electrode layer 12 is formed together when data wirings including source and drain electrodes are formed in the TFT formation region (b) and made of the same material as that of the data wirings. Also, the insulating layer 14 includes a gate insulating film and a protective film, and formed together when a gate insulating film and a protective film are formed in the TFT formation region (b) and made of the same material as that of the gate insulating film and the protective film. The second electrode layer 16 is formed together when a pixel electrode is formed in the TFT formation region (b) and made of the same material as that of the pixel electrode. Here, a plurality of connection electrodes (not shown) is formed on the second electrode layer 16 and electrically connected to the flexible circuit board 70.

A plurality of TFTs (not shown) are formed on the substrate 10 of the TFT formation region (b), and a common electrode 32 is formed on a color filter substrate 30 disposed to correspond to the array substrate 10.

Meanwhile, in the liquid crystal panel, in order to receive a driving signal provided from a printed circuit board (PCB) (not shown), the pad region (a) of the array substrate 10 is electrically connected to the flexible circuit board 70. Here, a driving chip 74 is mounted on the flexible circuit board 70, and in this case, for example, a gate driving chip or a data driving chip may be mounted on the flexible circuit board 70.

A connection wiring 76 is formed on the flexible circuit board 70 and electrically connected to the pad region (a) of the array substrate 10, and in this case, the connection wirings 76 equal to the number of connection electrodes formed in the pad region (a) of the array substrate 10 may be formed.

The pad region (a) of the array substrate 10 and the connection wiring 76 of the flexible circuit board 70 are attached by an anisotropic conductive film (ACF) 50. Thus, a driving signal provided from the PCB is delivered to the TFT formed in the TFT formation region (b) through the connection wiring 76 of the flexible circuit board 70, the ACF 50, and a plurality of connection electrodes formed in the pad region (a) of the array substrate 10.

As illustrated in FIG. 2A, a plurality of connection electrodes 16_1 through 16_5 are formed on the second electrode layer 16 of the pad region (a) of the array substrate 10, and a plurality of contact holes 15 are formed to be in contact with the ACF 50.

As illustrated in FIGS. 2B and 2C, when a gate electrode is formed in the TFT formation region (b), the first electrode layer 12 is also formed together in the pad region (a) of the substrate 10 by using the same material as that of the gate electrode. The insulating layer 14 comprised of the gate insulating film 14a and the protective film 14b is formed together on the first electrode layer 12 when the gate insulating film and the protective film are formed in the TFT formation region (b). A contact hole 15 is formed to expose a certain region of the first electrode 12. The connection electrode 16-1 electrically connected to the exposed first electrode layer 12 on the insulating layer 14. Here, the connection electrode 16_1 is formed together when the pixel electrode is formed in the TFT formation region (b) and made of the same material as that of the pixel electrode.

As illustrated in FIG. 3, when the liquid crystal panel is operated at room temperature in a state in which the plurality of connection electrodes 16_1 to 16_5 of the pad region (a) of the array substrate 10 are attached to the connection wiring 76 of the flexible circuit board 70 by the ACF 50, there is no problem with the operation of the liquid crystal panel. However, when the liquid crystal panel is operated at a high temperature, the number of contact points P1 to P4 at which the connection electrodes 16_1 through 16_5 of the pad region (a) and the connection wiring of the flexible circuit board 70 are in contact is reduced. For example, assuming that the liquid crystal panel is operated at a room temperature and the number of contact points at which the connection electrodes 16_1 through 16_5 of the pad region (a) and the connection wiring of the flexible circuit board 70 is 10. However, when the liquid crystal panel is operated in a high temperature environment, the number of contact points P1 through P4 at which the connection electrodes 16_1 to 16_5 of the pad region (a) and the connection wiring of the flexible circuit board 70 is reduced to 4.

Thus, abnormal operation of the liquid crystal panel and defective data line occur at a high frequency. An electrical defect is also generated as contact resistance between the connection electrodes 16_1 through 16_5 of the pad region (a) and the connection wiring of the flexible circuit board 70 is high.

SUMMARY OF THE INVENTION

An aspect of the present invention provides an array substrate in which a wiring of a pad region is formed without an insulating film or without an insulating film and an organic film to reduce occurrence of abnormal operations due to an increase in resistance caused by contact margin in a high temperature environment, and a method for manufacturing the same.

Another aspect of the present invention provides an array substrate in which a wiring of a pad region is formed without an insulating film or without an insulating film and an organic film to reduce abnormal operations, thus enhancing reliability, and a method for manufacturing the same.

According to an aspect of the present invention, an array substrate includes: an insulating substrate including a pad region and a thin film transistor (TFT) formation region; a first electrode layer formed in the pad region of the substrate; and a second electrode formed on the first electrode layer in an overlapping manner.

The second electrode layer may include a plurality of connection electrodes formed to be spaced apart from each other.

The plurality of connection electrodes may be electrically connected to a plurality of connection wirings formed on a flexible circuit board by an anisotropic conductive film (ACF).

The plurality of connection electrodes may be formed to be equal to the number of the plurality of connection wirings.

The plurality of connection electrodes may be formed to correspond to the plurality of connection wirings, respectively.

The first electrode layer may be formed together when a gate electrode is formed in the TFT formation region and made of the same material as that of the gate electrode.

The second electrode layer may be formed together when a pixel electrode is formed in the TFT region and made of the same material as that of the pixel electrode.

According to another aspect of the present invention, a method for manufacturing an array substrate is provided. The method may include: providing an insulating substrate including a pad region and a thin film transistor (TFT) formation region; forming a first electrode layer in the pad region of the substrate; and forming a second electrode layer on the first electrode layer in an overlapping manner.

The second electrode layer may include a plurality of connection electrodes formed to be spaced apart from each other.

The plurality of connection electrodes may be electrically connected to a plurality of connection wirings formed on a flexible circuit board by an anisotropic conductive film (ACF).

The plurality of connection electrodes may be formed to be equal to the number of the plurality of connection wirings.

The plurality of connection electrodes may be formed to correspond to the plurality of connection wirings, respectively.

The first electrode layer may be formed together when a gate electrode is formed in the TFT formation region and made of the same material as that of the gate electrode.

The second electrode layer may be formed together when a pixel electrode is formed in the TFT region and made of the same material as that of the pixel electrode.

As described above, in the case of the array substrate and the method for manufacturing the same according to embodiments of the present invention, since the wiring of the pad region of the array substrate is formed without an insulating film or without an insulating film and an organic film, abnormal operations due to an increase in resistance caused by a contact margin in a high temperature environment can be reduced.

In addition, in the case of the array substrate and the method for manufacturing the same according to embodiments of the present invention, since occurrence of abnormal operations is reduced by forming the wiring of the pad region of the array substrate without an insulating film or without an insulating film and an organic film, reliability can be enhanced.

The foregoing and other objects, features, aspects and advantages of the present invention will become more apparent from the following detailed description of the present invention when taken in conjunction with the accompanying drawings.

DETAILED DESCRIPTION OF THE INVENTION

An array substrate and a method for manufacturing the same according to embodiments of the present invention will be described in detail with reference to the accompanying drawings.

Figure 4:
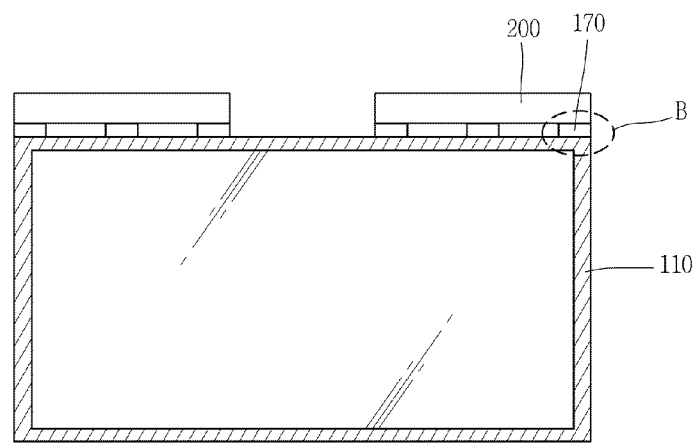
FIG. 4 is a view illustrating a connective relationship between a liquid crystal panel and a printed circuit board (PCB), according to one embodiment of the present invention.
Figure 5:
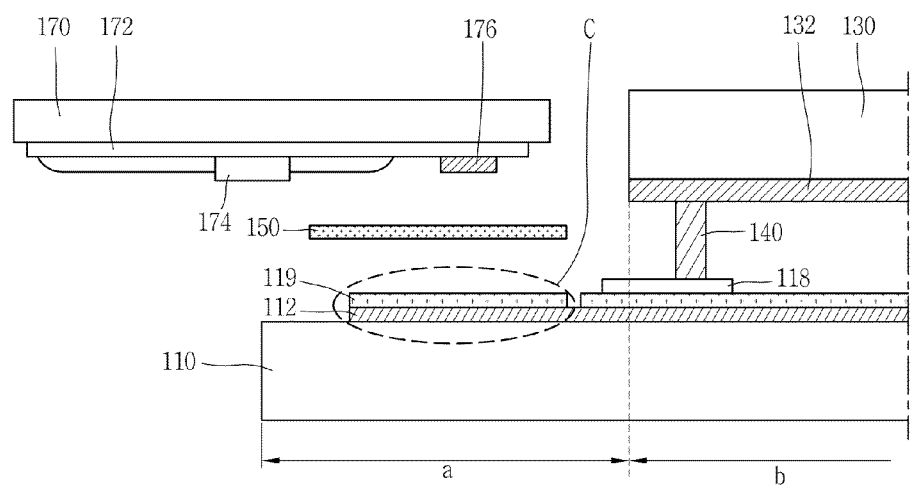
FIG. 5 is an enlarged view of a portion 'B' in FIG. 4, according to one embodiment of the present invention.
Figure 6A:
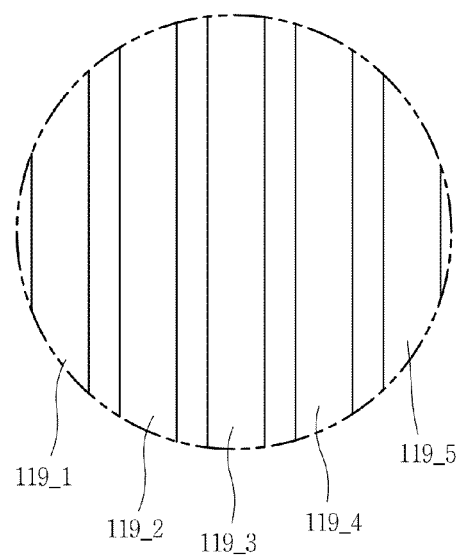
FIG. 6A is an enlarged view of a portion 'C' in FIG. 5, according to one embodiment of the present invention.
Figure 6B:
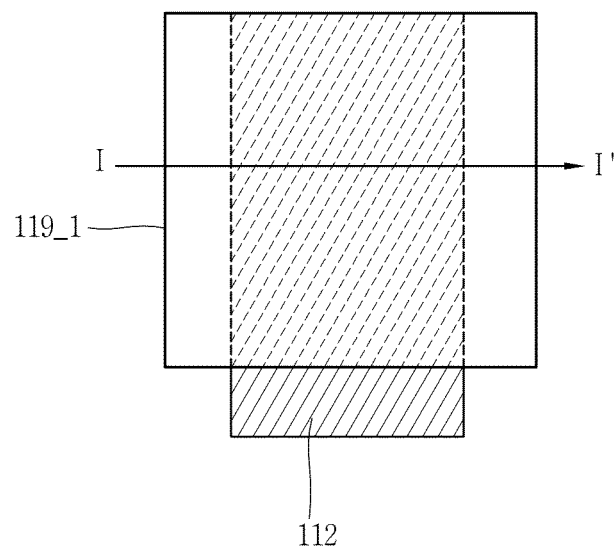
FIG. 6B is a plan view of a second electrode layer in FIG. 6A, according to one embodiment of the present invention.
Figure 6C:
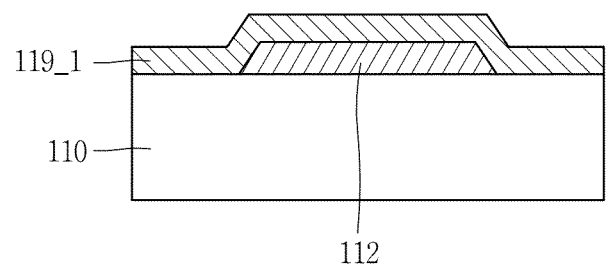
FIG. 6C is a sectional view taken along line II-II' in FIG. 6B, according to one embodiment of the present invention.

FIG. 4 is a view illustrating a connective relationship between a liquid crystal panel and a printed circuit board (PCB), according to one embodiment of the present invention. FIG. 5 is an enlarged view of a portion 'B' in FIG. 4. FIG. 6A is an enlarged view of a portion 'C' in FIG. 5. FIG. 6B is a plan view of a second electrode layer in FIG. 6A. FIG. 6C is a sectional view taken along line II-II' in FIG. 6B.

As illustrated in FIG. 4, a liquid crystal panel according to one embodiment of the present invention is electrically connected to a printed circuit board (PCB) 200 by a flexible circuit board 170. Here, a plurality of components are mounted on the PCB 200, and generate a plurality of driving signals for driving the liquid crystal panel and transfer the same to the flexible circuit board 170.

As illustrated in FIG. 5, the array substrate 110 according to one embodiment of the present invention includes a pad region (a) and a thin film transistor (TFT) formation region (b).

A first electrode layer 112 and a second electrode layer 119 are sequentially formed on the substrate 110 of the pad region (a). Here, the first electrode layer 112 is formed together when data wirings including source and drain electrodes are formed in the TFT formation region (b) and made of the same material as that of the data wirings. Also, the second electrode layer 119 is formed together when a pixel electrode is formed in the TFT formation region (b) and made of the same material as that of the pixel electrode. Here, a plurality of connection electrodes (not shown) are formed to be spaced apart from each other on the second electrode layer 119 such that they are electrically connected to the flexible circuit board 170.

A plurality of TFTs (not shown) are formed on the substrate 110 of the TFT formation region (b), and a black matrix (not shown), a color filter layer (not shown), and a common electrode 132 are formed on a color filter substrate 130 disposed to correspond to the array substrate 110.

Meanwhile, in the liquid crystal panel, in order to receive a plurality of driving signals provided from the PCB (not shown), the pad region (a) of the array substrate 110 is electrically connected to the flexible circuit board 170. Here, a driving chip 174 is mounted on the flexible circuit board 170, and in this case, for example, a gate driving chip may be mounted on the flexible circuit board 70.

A connection wiring 176 is formed on the flexible circuit board 170 and electrically connected to the pad region (a) of the array substrate 110, and in this case, a number of connection wirings 176 equal to the number of connection electrodes formed in the pad region (a) of the array substrate 110 may be formed. Also, the plurality of connection electrodes formed in the pad region (a) of the array substrate 110 and the plurality of connection wirings 176 formed on the flexible circuit board 170 may be formed to correspond to each other.

The pad region (a) of the array substrate 110 and the connection wiring 176 of the flexible circuit board 170 are attached by an anisotropic conductive film (ACF) 150. Thus, a plurality of driving signals provided from the PCB is delivered to the plurality of TFTs formed in the TFT formation region (b) through the connection wiring 176 of the flexible circuit board 170, the ACF 150, and a plurality of connection electrodes formed in the pad region (a) of the array substrate 10.

As illustrated in FIG. 6A, a plurality of connection regions 119_1 through 119_5 are formed to be spaced apart from each other on the first electrode layer 112 of the pad region (a) of the array substrate 110 according to an embodiment of the present invention such that they are in direct contact with the first electrode layer 112 without a formation of an insulating film.

As illustrated in FIGS. 6B and 6C, when a gate electrode is formed in the TFT formation region (b) of the array substrate 110 according to one embodiment of the present invention, the first electrode layer 112 is also formed together in the pad region (a) of the substrate 110 by using the same material as that of the gate electrode. Also, in one embodiment of the present invention, the connection electrode 119_1 is formed on the first electrode layer such that it is directly in contact with the first electrode layer 112 without a formation of an insulating film. Here, the second electrode layer 119 is formed to overlap with the first electrode layer 112.

Figure 2A:
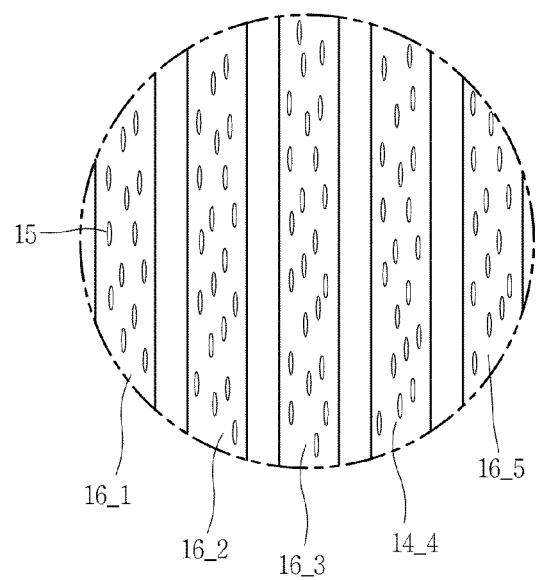
FIG. 2A is an enlarged view of a portion 'A' in FIG. 1.
Figure 2B:
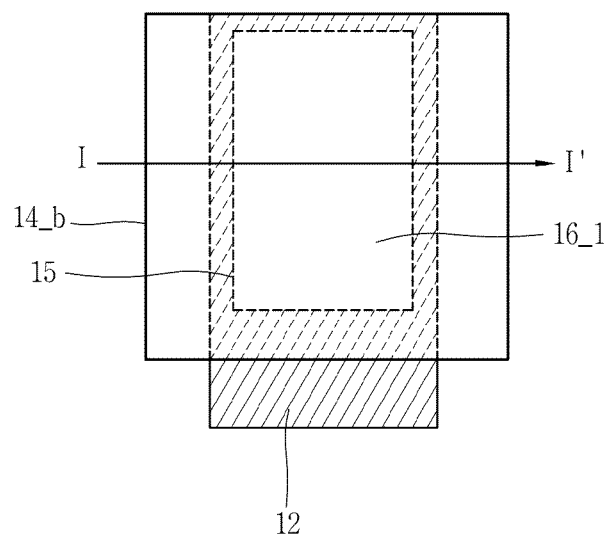
FIG. 2B is a plan view of a second electrode layer in FIG. 1.
Figure 2C:
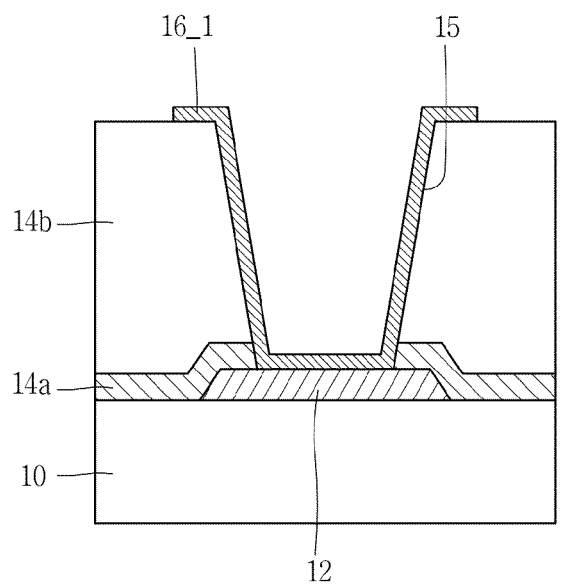
FIG. 2C is a sectional view taken along line I-I' in FIG. 2B.

Meanwhile, in an example illustrated in FIG. 2C, the insulating layer 14 is formed on the first electrode layer 12 in the pad region (a) of the array substrate 10, the contact hole 15 is formed to expose a certain region of the first electrode layer 12 by etching the insulating layer 14, and then, the first electrode layer 12 is electrically connected to the second electrode layer 16 through the contact hole 15.

Figure 3:
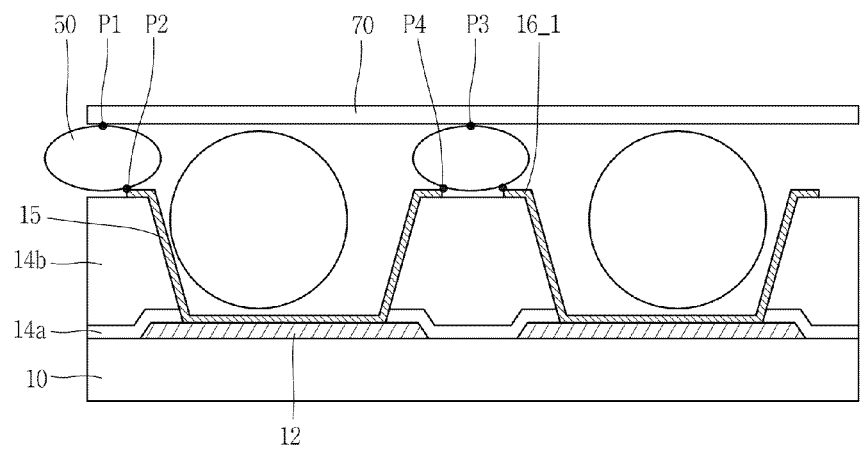
FIG. 3 is a view illustrating an example connective relationship between an array substrate and a flexible circuit board.

However, as illustrated in FIG. 3, when the liquid crystal panel is operated at a high temperature, the number of contact points P1 through P4 at which the connection electrodes 16_1 to 16_5 of the pad region (a) and the connection wiring of the flexible circuit board 70 are in contact is reduced, causing frequent abnormal operations of the liquid crystal panel and defects. Also, an electrical defect generated as contact resistance between the connection electrodes 16_1 through 16_5 of the pad region (a) and the connection wiring of the flexible circuit board 70 is high.

In order to solve the problem, in one embodiment of the present invention, the second electrode layer 119, namely, the connection electrode 119_1, is formed on the first electrode layer 112 without the formation of an insulating film. Thus, when the flexible circuit board 170 and the array substrate 110 are electrically connected, the plurality of connection electrodes 119_1 through 119_5 formed in the pad region (a) of the array substrate 110 are directly in contact with the ACF 150, and thus, when the liquid crystal panel is operated at a high temperature, resistance due to a contact margin is reduced, reducing the frequency of abnormal operations and enhancing the reliability of the liquid crystal panel.

In one embodiment of the present invention, the data wirings formed in the pad region (a) of the array substrate 110 have been described as an example, but the present invention may also be applicable to gate wirings (namely, the gate wiring may be formed in the same manner).

Figure 7A:
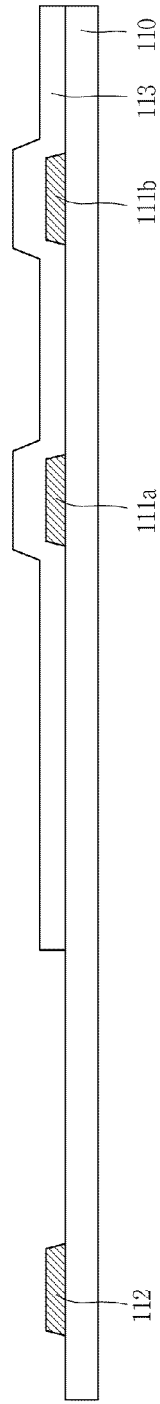
FIGS. 7A to 7E are sectional views sequentially showing processes of a method for manufacturing an array substrate, according to one embodiment of the present invention.

FIGS. 7A to 7E are sectional views sequentially showing processes of a method for manufacturing an array substrate, according to one embodiment of the present invention. As illustrated in FIG. 7A, the array substrate 110 includes the pad region (a) and the TFT formation region (b), and a first metal material is deposited on the substrate 110. The first metal material may be any one selected from the group consisting of aluminum (Al), copper (Cu), silver (Ag), molybdenum (Mo), chromium (Cr), titanium (Ti), tantalum (Ta), or an alloy thereof.

Also, the first metal material may have a multi-film structure including a dual-layer structure or a triple-layer structure having two or more layers with different physical qualities. When the first metal material is formed to have a dual-film structure, one of the films may be made of a metal having low specific resistance (e.g., aluminum (or an alloy thereof), silver (or an alloy thereof), copper (or an alloy thereof)). In this case, the other film may be made of a material (e.g., molybdenum, chromium, titanium, tantalum, or an alloy thereof) having excellent contact characteristics with indium tin oxide (ITO), indium zinc oxide (IZO), and the like.

Next, a first photoresist pattern (not shown) is formed on the first metal material and selectively etched by using the first photoresist pattern as an etch mask to form the first electrode layer 112 and the gate electrodes 111a and 111b in the pad region (a) and the TFT formation region (b) of the substrate 110, respectively.

And then, the gate insulating film 113 is formed on the entire surface of the substrate including the first electrode layer 112 and the gate electrodes 111a and 111b. The gate insulating film 113 may be any one selected from among an inorganic insulating film such as silicon nitride film (SiNx) or a silicon oxide film (SiO$_2$), and a high dielectric oxide film such as hafnium oxide or aluminum oxide.

Thereafter, a second photoresist pattern (not shown) is formed on the gate insulating film 113, and then, the gate insulating film 113 of the pad region (a) is etched to be removed by using the second photoresist pattern as an etch mask such that the first electrode layer 112 formed in the pad region (1) is exposed.

Figure 7B:
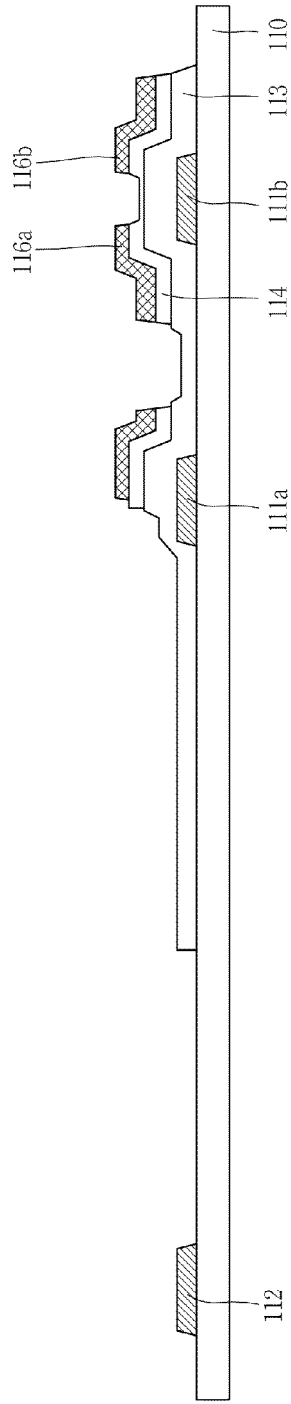

As illustrated in FIG. 7B, an active layer material and a second metal material are sequentially deposited on the gate insulating film 113, and thereafter, a third photoresist pattern (not shown) is formed. Subsequently, the second metal material and the active layer material are selectively patterned by using the third photoresist pattern as an etch mask to form an active layer 114, a source electrode 116a, and a drain electrode 116b.

In this case, the active layer 114 may be made of semiconductor such as hydrogenated amorphous silicon, polycrystalline silicon, or the like, and the source electrode 116a and the drain electrode 116b may be made of, for example, any one selected from among aluminum (Al), copper (Cu), silver (Ag), molybdenum (Mo), chromium (Cr), titanium (Ti), tantalum (Ta), or an alloy thereof. Also, the source electrode 116a and the drain electrode 116b may have a dual-film or triple-film structure including two or more layers having different physical qualities.

Figure 7C:
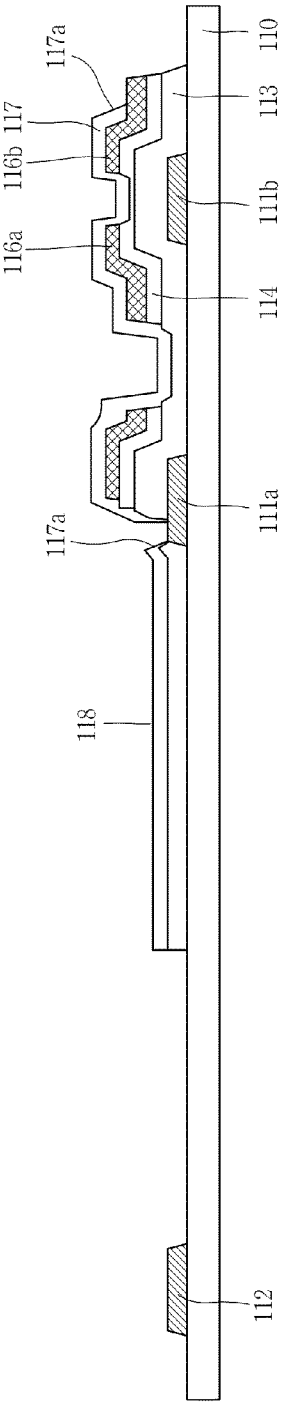

As illustrated in FIG. 7C, an insulating film 117 is formed on the entire surface of the substrate 110 including the source electrode 116a and the drain electrode 116b. Thereafter, a fourth photoresist pattern (not shown) is formed on the insulating film 117, and the insulating film 117 is selectively patterned by using the fourth photoresist pattern as an etch mask to form a contact hole 117a exposing certain portions of the drain electrode 116b, the first common electrode 112b, and the gate pad 112c of the pad region (a).

The insulating film 117 formed on the first electrode layer 112 of the pad region (a) is removed. The reason for removing the insulating film 117 is to allow the second electrode layer 119 and the first electrode layer 112 formed in the follow-up process to be directly in contact with each other.

Figure 7D:
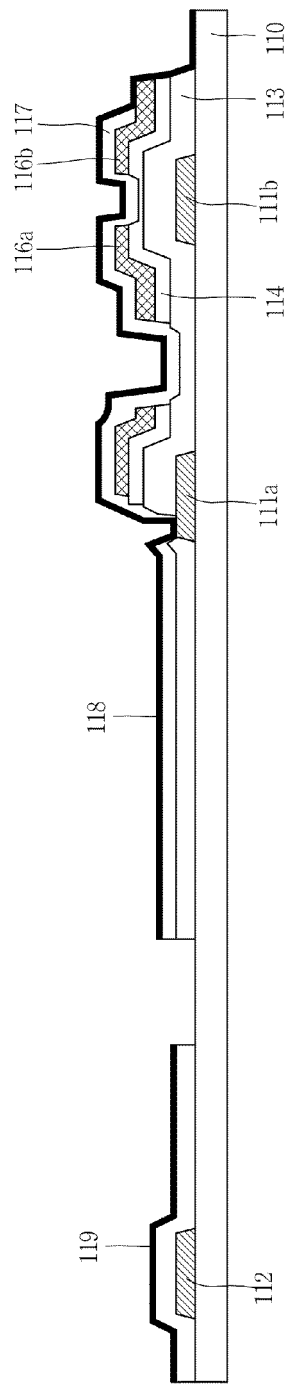

As illustrated in FIG. 7D, a transparent conductive material is deposited on the insulating film 117, and a fifth photoresist pattern is formed on the conductive material. Subsequently, the conductive material is selectively patterned by using the fifth photoresist pattern as an etch mask to form the second electrode layer 119 and the pixel electrode 118 in the pad region (a) and the TFT formation region (b), respectively. In this case, the transparent conductive material may be, for example, ITO.

Here, after the transparent conductive material is deposited on the insulating film 117, the surface of the conductive material may be plasma-processed (not shown). The plasma processing may be, for example, hydrogen plasma processing.

Figure 7E:
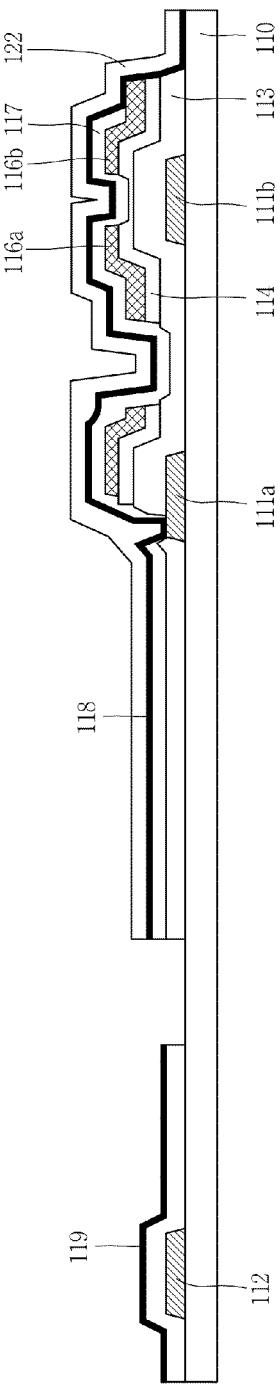

As illustrated in FIG. 7E, a protective film 122 is formed on the entire surface of the substrate including the pixel electrode 118 and the second electrode layer 119. Thereafter, a sixth photoresist pattern (not shown) is formed on the protective film 122, and selectively etched to be removed by using the sixth photoresist pattern as an etch mask such that the second electrode layer 119 of the pad region (a) is exposed.

Figure 1:
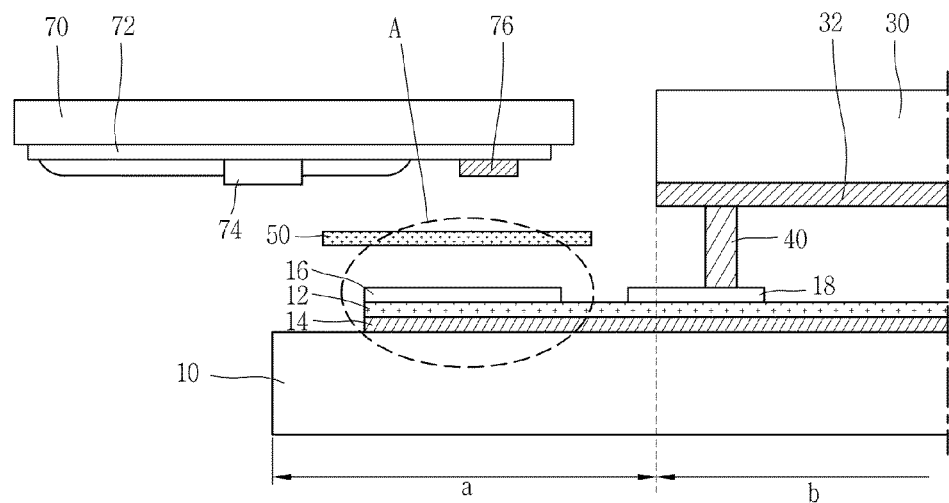
FIG. 1 is a view illustrating an example connective relationship between a liquid crystal panel and a flexible circuit board.
Figure 8:
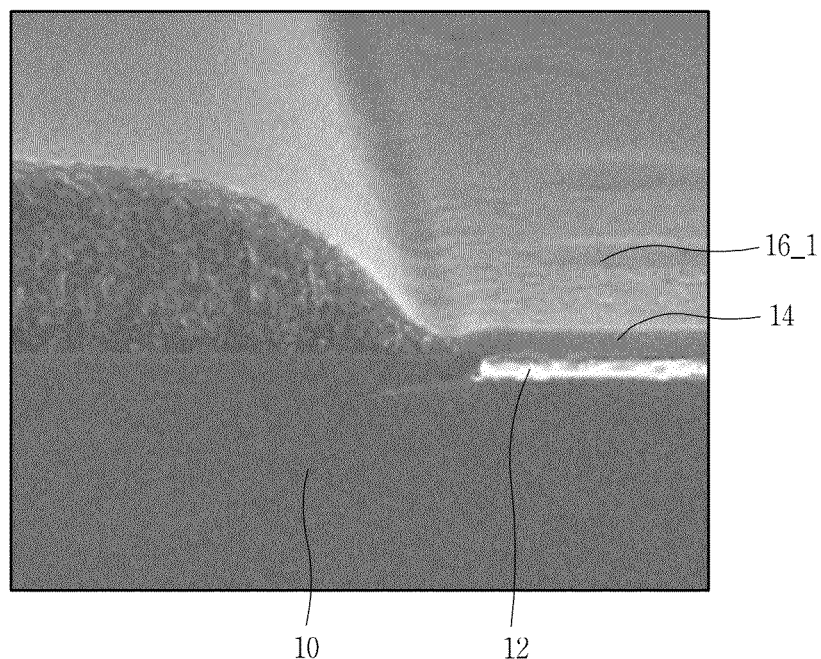
FIG. 8 is a process sectional view illustrating an example second electrode layer formed in a pad region of the substrate.
Figure 9:
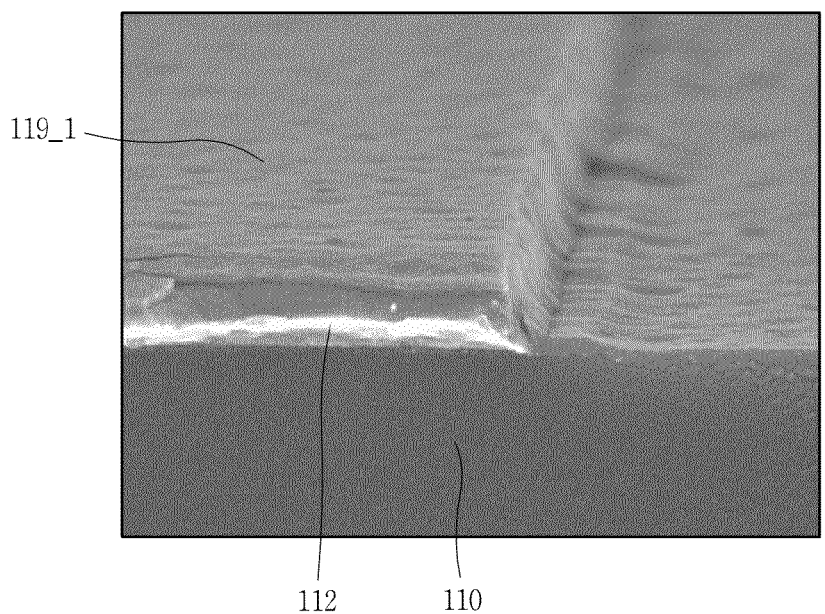
FIG. 9 is a process sectional view illustrating a second electrode layer formed in a pad region of the substrate according to one embodiment of the present invention.

FIG. 8 is a sectional view illustrating a second electrode layer formed in a pad region of the substrate according to the examples of FIGS. 1 through 3. FIG. 9 is a sectional view illustrating a second electrode layer formed in a pad region of the substrate according to one embodiment of the present invention.

As illustrated in FIG. 8, the examples of FIGS. 1 through 3, after the plurality of connection electrodes 16_1 to 16_5 formed in the pad region (a) of the array substrate 10 and the connection wiring 76 formed in the flexible circuit board 70 are attached by using the ACF 50, when the liquid crystal panel is operated at a high temperature, the number of the contact points P1 through P4 at which the connection electrode 16_1 of the pad region (a) and the connection wiring of the flexible circuit board 70 are in contact is reduced.

In contrast, in the embodiment of FIG. 9, the second electrode layer 119 of the pad region (a) of the array substrate 110 is formed to be directly in contact with the first electrode layer without a lower insulating film, and the flexible circuit board 170 is attached to the pad region (a) of the array substrate 110. Hence, a contact point between the connection electrode 119_1 of the pad region (a) and the connection wiring of the flexible circuit board 170 is eliminated, thereby reducing an increase in resistance due to a contact margin when the liquid crystal panel is operated at a high temperature.

Also, in an embodiment of the present invention, since an increase in resistance due to a contact margin is reduced, occurrence of abnormal operations of the liquid crystal panel can be reduced.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for manufacturing an array substrate, the method comprising:
    forming a first electrode layer in a pad region of an insulating substrate adjacent to a thin film transistor (TFT) formation region of the insulating substrate;
    depositing an insulation layer over the formed first electrode layer and the insulation substrate;
    removing the insulation layer from the pad region to expose a top surface and side surfaces of the first electrode layer; and
    forming a second electrode layer directly on the exposed first electrode layer to cover the top surface after removing the insulation layer from the pad region.

2. The method of claim 1, patterning the second electrode layer to form a plurality of connection electrodes spaced apart from each other.

3. The method of claim 2, further comprising connecting the plurality of the connection electrode to a plurality of connection wirings on a flexible circuit board via an anisotropic conductive film (ACF).

4. The method of claim 2, wherein the number of the plurality of connection electrodes are equal to the number of the plurality of connection wirings.

5. The method of claim 2, wherein each of the plurality of connection electrodes are formed to correspond to each of the plurality of connection wirings.

6. The method of claim 1, further comprising forming gate electrodes on the insulating substrate simultaneously with forming of the first electrode layer.

7. The method of claim 6, the first electrode layer in the TFT formation region is a same material as the gate electrodes.

8. The method of claim 1, further comprising forming pixel electrodes in the TFT formation region simultaneously with forming of the second electrode layer.

9. The method of claim 8, wherein the second electrode layer is formed in the TFT region with a same material as the pixel electrodes.

* * * * *